United States Patent
Johansson et al.

(10) Patent No.: US 7,067,958 B2
(45) Date of Patent: Jun. 27, 2006

(54) WIDE FREQUENCY RANGE ELECTROMECHANICAL ACTUATOR

(75) Inventors: Stefan Johansson, Uppsala (SE); Mats Bexell, Uppsala (SE); Anders Jansson, Uppsala (SE)

(73) Assignee: Piezomotor Uppsala AB, Uppsala (SE)

( * ) Notice: Subject to any disclaimer, the term of this patent is extended or adjusted under 35 U.S.C. 154(b) by 130 days.

(21) Appl. No.: 10/778,348

(22) Filed: Feb. 17, 2004

(65) Prior Publication Data

US 2005/0179343 A1    Aug. 18, 2005

(51) Int. Cl.
*H02N 2/02*    (2006.01)
*H01L 41/16*    (2006.01)

(52) U.S. Cl. .......................... 310/323.11; 310/323.01; 310/323.02; 310/323.03; 310/323.04; 310/323.05; 310/323.08

(58) Field of Classification Search .................. 310/323
See application file for complete search history.

(56) References Cited

U.S. PATENT DOCUMENTS

| | | | | |
|---|---|---|---|---|
| 5,345,137 | A * | 9/1994 | Funakubo et al. ..... | 310/323.16 |
| 5,633,554 | A * | 5/1997 | Kaji ........................... | 310/328 |
| 5,952,766 | A * | 9/1999 | Mukohjima et al. ... | 310/323.04 |
| 6,066,911 | A * | 5/2000 | Lindemann et al. ... | 310/323.02 |
| 6,184,609 | B1 * | 2/2001 | Johansson et al. .......... | 310/328 |
| 6,313,566 | B1 | 11/2001 | Cunningham et al. | |
| 6,337,532 | B1 * | 1/2002 | Johansson et al. ..... | 310/323.02 |
| 6,838,808 | B1 * | 1/2005 | Tanaka ........................ | 310/328 |
| 6,864,620 | B1 * | 3/2005 | Takeuchi et al. ............ | 310/334 |

2003/0085633 A1    5/2003    Marth

FOREIGN PATENT DOCUMENTS

DE    44 08 618    9/1995
WO    WO 03/094252 A2    11/2003

OTHER PUBLICATIONS

Hengchu Cao et al., "Nonlinear Deformation of Ferroelectric Ceramics", Journal of the American Ceramic Society, vol. 76, No. 4, 1993, pp. 890-896.
Stefan Johansson, "One approach towards the fabrication of a microrobot system", Materials Science and Engineering C2, 1995, pp. 141-149.

* cited by examiner

*Primary Examiner*—Darren Schuberg
*Assistant Examiner*—J. Aguirrechea
(74) *Attorney, Agent, or Firm*—Young & Thompson

(57) ABSTRACT

An electromechanical actuator 10 is disclosed, having drive elements (14a–d) movable in two dimensions and connected to an actuator backing (12). The actuator backing (12) is made of a material being ferromechanically inactive. Furthermore, the joint between the drive element (14a–d) and the actuator backing (12) is stiff and highly stable. This is achieved by use of an irreversible joint made e.g. by thermoset plastic glues, diffusion bonding or co-sintering. Co-sintering is to prefer. The actuator backing (12) material is selected to be stiff, preferably having a stiffness above 70 GPa and more preferably above 100 GPa, and having a high heat conductivity, preferably above 5 W/mK and more preferably above 10 W/mK, Electrodes (22) are preferably integrated in the actuator backing to increase stiffness as well as improving the heat conductivity. The drive elements (14a–d) are preferably covered (28, 26), at least at the driving surface, by heat-conducting material.

17 Claims, 4 Drawing Sheets

US 7,067,958 B2

WIDE FREQUENCY RANGE ELECTROMECHANICAL ACTUATOR

TECHNICAL FIELD

The present invention relates in general to electromechanical actuators, and in particular to electromechanical actuators utilizing drive elements presenting a two-dimensional motion pattern.

BACKGROUND

Electromechanical actuators, and particularly electromechanical motors, have been widely applied for many different tasks during recent years. High force, small size, high speed, high-precision positioning and inexpensive manufacturing are attractive characteristics of many of the prior-art motors. However, the attractive characteristics are often contradictory, and optimizing regarding one aspect often reduces other qualities.

Electromechanical actuator arrangements using drive elements presenting a two-dimensional motion have been discussed for awhile. In U.S. Pat. No. 5,345,137, a two-dimensional driving ultrasonic motor is disclosed. By laminating electromechanical volumes with electrodes having different geometrical extensions, the entire stack can be controlled to bend in different directions.

In the article by S. Johansson, "One approach towards the fabrication of a microrobot system", Material Science and Engineering C2 (1995), pp. 141–149, an actuator comprising six hexagonal elements soldered onto a common actuator backing is proposed. The hexagonal elements have an electrode structure, which enables the top of the elements to move in a controlled manner in three dimensions. A stepping mechanism can be obtained, presenting extremely high precision. In the closely related patent U.S. Pat. No. 6,184,609, the arrangement is improved by having the actuator backing and the elements manufactured as one integrated monolithic block. Such arrangement further improved the positioning precision using a non-resonant repetition of small steps. However, the speed and power efficiency was somewhat limited.

In DE 4408618, a common base connects two sets of bimorph drive elements to each other. The drive elements and the base are cut out from a common piezoceramic plate. The drive elements are driven by phase-shifted sinusoidal voltages giving rise to elliptical motion paths of the tips of the elements. A similar approach is used in U.S. Pat. No. 6,066,911. Stacks of piezoelectric layers are formed side by side on a common piezoelectric base. This drive element was intended to be driven in the ultrasonic frequency range, and thereby benefit from high speed and high power efficiency. However, estimations of operation conditions based on the information given in this disclosure reveals that the drive element would be difficult to operate for any longer periods of time. The excitation and de-excitation of the piezoceramic material develops a lot of heat. Driving the disclosed drive element at the proposed conditions would within a very short time lead to an extensive heating of the drive elements. Such heating typically leads to unpredictable remaining deformations of the drive elements and the actuator backing, weakening of soldered joints and if the Curie temperature of the drive elements is exceeded, the polarization of the drive elements will disappear.

In U.S. Pat. No. 6,337,532, a similar basic approach is used, but the operation is intended for a non-resonant walking operation. The excitation of the piezo-legs is performed in a very controlled manner, giving a smooth motion and a very accurate positioning. However, the operation frequencies are far below resonance.

SUMMARY

One general problem with prior-art devices is that there are temperature problems at high operation frequencies. Another general problem is that the stator arrangements typically are somewhat mechanically deformed with time, typically due to ferromechanical deformation in supporting parts or plastic deformation in joints, which influences positioning accuracy.

A general object of the present invention is therefore to provide electromechanical actuators that are operable over a wide frequency range with a high positioning accuracy. A further object of the present invention is to provide electromechanical actuators being easy to cool during operation.

The above objects are achieved by electromechanical actuators according to the enclosed patent claims. In general words, an electromechanical actuator has drive elements movable in two dimensions and connected to an actuator backing. The actuator backing is made of a material being ferromechanically inactive, i.e. e.g. non-piezoelectric. Furthermore, the joint between the drive element and the actuator backing is stiff and highly stable. This is achieved by use of an irreversible joint made e.g. by thermoset plastic glues, diffusion bonding or co-sintering. Co-sintering is to prefer. The actuator backing material is selected to be stiff, preferably having a stiffness above 70 GPa and more preferably above 100 GPa, and having a high heat conductivity, preferably above 5 W/mK and more preferably above 10 W/mK. Electrodes are preferably integrated in the actuator backing to increase stiffness as well as improving the heat conductivity. The drive elements are preferably covered, at least at the driving surface, by heat-conducting material.

One advantage with the present invention is that high speeds, in the order of 100 mm/s, can be combined with relatively high forces, in the order of 5–10 N, as well as nanometer positioning capabilities.

BRIEF DESCRIPTION OF THE DRAWINGS

The invention, together with further objects and advantages thereof, may best be understood by making reference to the following description taken together with the accompanying drawings, in which:

FIG. 5b is a diagram illustrating the basic principle for motion of the drive element of FIG. 5a.

DETAILED DESCRIPTION

Figure 1:
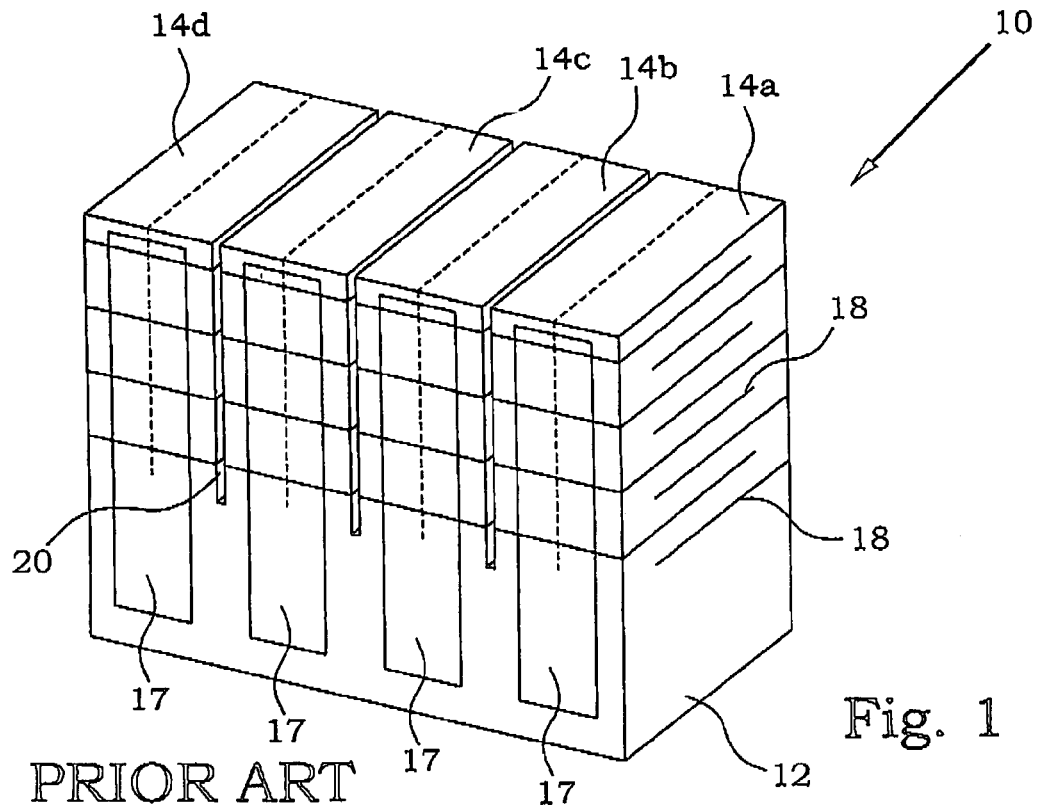
FIG. 1 is a perspective view of a drive element having four legs.

In FIG. 1, an embodiment of a drive element, basically according to U.S. Pat. No. 6,337,532 is illustrated. We will in the present disclosure use such an actuator drive element as a model device, however, the invention can be applied to many other types of actuators as well. The drive element 10 comprises an actuator backing 12, from which four actuator elements 14a–d or "legs" protrude, separated by cuts 20. The actuator elements 14a–d have two independently controllable active volumes each (the border is illustrated by the broken line), which are excited by applying voltage signals between different electrodes 18. The voltage signals are provided to the actuator elements 14a–d by contacting electrodes 17 at the sides of the legs.

Figure 2:
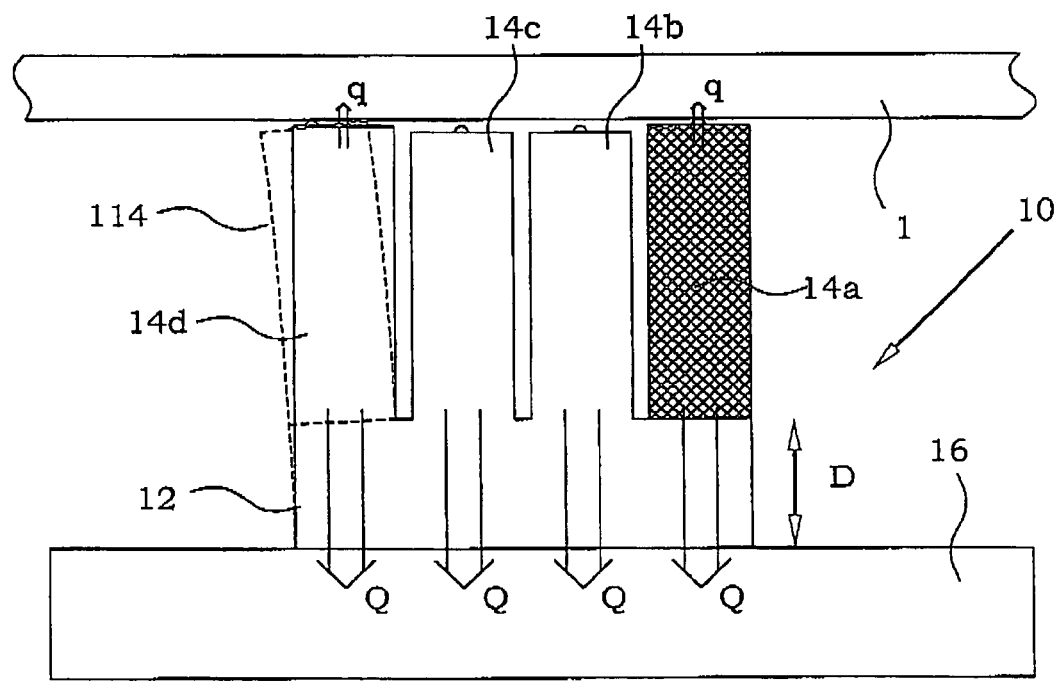
FIG. 2 is an illustration of heat flow in and deformation of drive elements.

FIG. 2 is a somewhat simplified illustration of the drive element of FIG. 1 in action. The legs 14a–d are activated in pairs, and at least one pair is always in contact with a body 1 to be moved. The motion of the legs 14a–d involves excitation and de-excitation of the electromechanical volumes of the legs 14a–d. Such activities generate heat. The entire active volume of the drive element 10 participates in this heat production. In FIG. 2, the heat producing part of actuator element 14a is illustrated doubly hatched. The surrounding medium is typically air, which is a bad heat conductor. Furthermore, heat dissipation by radiation can be neglected. The heat can thus dissipate in two main directions. A smaller part of the heat q can be transferred to the body 1 to be moved, during the periods that the actuator element 14a–d is in mechanical contact with the body 1. The main heat transport path Q has to go through the actuator backing 12 to a heat sink 16, e.g. a metal housing, or via the electrical connections. The actuator elements 14a–d are due to manufacturing advantages typically manufactured in one piece together with the actuator backing 12, which means that the actuator backing typically contains the same material, however, not activated by any voltages. Since the electromechanical materials in general are rather brittle, the thickness D of the actuator backing 12 is typically relatively large. Electromechanical materials are also typically bad heat conductors, which means that also the main heat dissipation path Q is quite inefficient.

To reach high travelling velocities of a body to be moved, it is necessary to use high drive frequencies and high drive voltages. Such a combination can raise the temperature of the drive element significantly. Already at relatively low frequencies, such as 1–5 kHz, the heat generation often gets so high that the drive element 10 can be damaged. The amount of heat generated in an electromechanically active material depends mainly on electromechanical losses, which in turn depend on the type of material and the drive conditions, i.e. the electric field levels and excitation frequency. For designing a motor that can be operated quasi-statically in a wide frequency range, an efficient solution for cooling the drive legs is necessary. Often it is desired that the audible sound from a motor should be as low as possible. This is achieved when exciting the drive legs above frequencies of about 20 kHz. For many motor solutions, this is only possible for very short operation times, due to heating problems.

Electromechanical ceramic materials typically demonstrate ferroelastic effects when subjected to mechanical loads. Two important effects are the mechanical hysteresis, i.e. there will be an hysteresis in the stress-strain curve, and the ferroelastic deformation, see e.g. Cao, H. and Evans, A. G. "Nonlinear deformation of ferroelastic ceramics" in J. Am. Cer. Soc. 76 (1993), pp. 890–896. The ferroelastic deformation is problematic in a piezoelectric motor with a passive piezoelectric backing. The ferroelastic deformation can be explained as a mechanically induced polarization of the material. Since there are no electrodes in the backing the material will have a random polarization when fabricated. When subjected to mechanical load, the polarization might change and this polarization is associated with a shape change of the material. To get control of the polarization in the backing there should be electrodes, which is both complicated and expensive. There is also a possibility to have pre-deformation of the material to polarize the non-electrodes regions but heating of the material will depolarize the material, which then gives the opposite shape change.

When the drive element of FIG. 2 is operated, the force that the actuator element 14d applies to the actuator backing 12 may cause a permanent deformation of the actuator backing 12. This in turn leads to an angle and height error of the actuator element 14d, indicated in an exaggerated scale by the broken lines 114. The height and angles of the actuator element 14d will differ from the ideal, whereby the operation is detrimentally affected.

The same kind of geometrical inaccuracy can occur if the actuator backing 12 is not stiff enough. The deformations involved are then mainly of an elastic type, but the result for the positioning accuracy is basically the same. The relatively low stiffness of electromechanical material calls for a relatively thick actuator backing 12, which decreases the ability to remove the heat from the actuator elements 14a–d.

Figure 3:
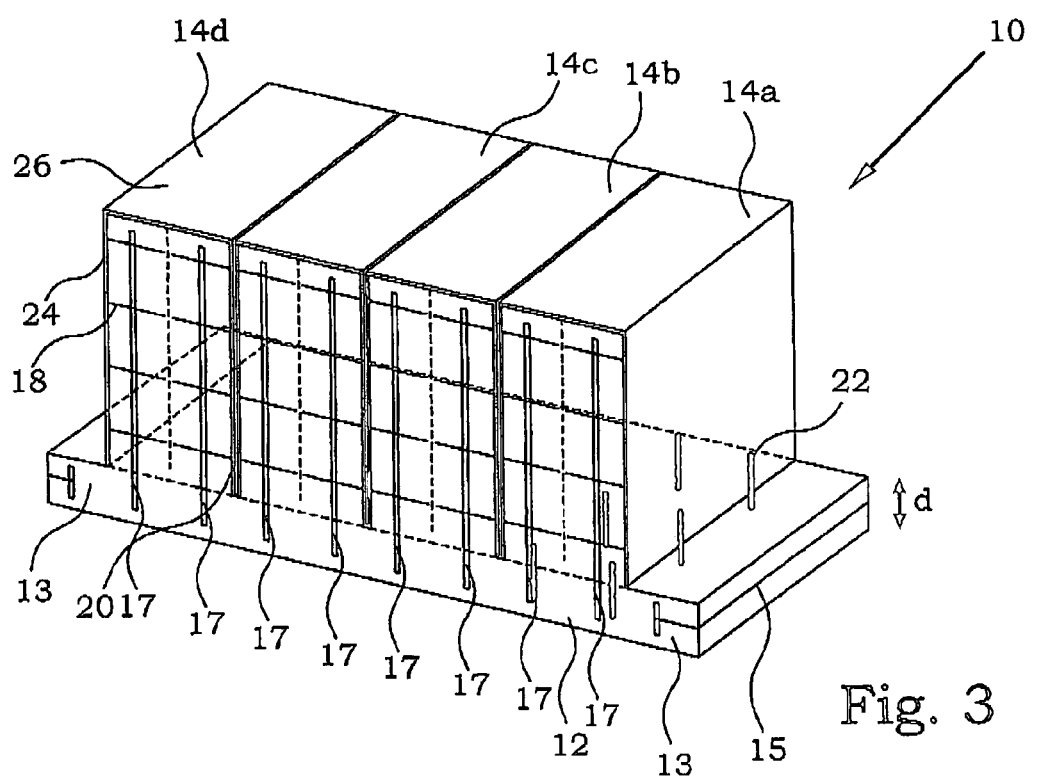
FIG. 3 is a perspective view of an embodiment of a drive element according to the present invention.

FIG. 3 illustrates a preferred embodiment of a drive element according to the present invention. As before, the drive element 10 of this particular embodiment comprises four legs 14a–d of electromechanically active material. However, the actuator backing 12 comprises here a ferromechanically inactive material. In such a way, any deformation due to ferromechanical effects is avoided. Furthermore, the actuator backing 12 is preferably made in a material having a higher heat conductivity than normal electromechanical materials. Preferably, the heat conductivity is higher than 5 W/mK and even more preferably higher than 10 W/mK. Examples of materials that are suitable as backing material are e.g. aluminum oxide and magnesium oxide.

In high precision positioning applications, the actuator backing 12 should, as mentioned above, be as stiff as possible to give a high stability and accuracy for the motion system. In particular when high forces or pressures are applied to an electromechanical material, unwanted shape changes of the material may occur. This may lead to a reduced positioning stability and accuracy for a positioning system. Since the actuator backing 12 in FIG. 3 is made of a non-electromechanical material, the actuator backing 12 has preferably a higher stiffness than the electromechanical materials. The stiffness is preferably at least 70 GPa, and even more preferably above 100 GPa. The increased stiffness also allows the actuator backing 12 to be designed considerably thinner, as illustrated by the reference letter d, than if an electromechanical material would have been used. This has two main advantages, it increases the heat conduction through the actuator backing 12 and it allows for reduced dimensions in designing of miniature applications. Examples of suitable actuator backing materials are non-electromechanical materials with high stiffness, such as aluminum oxide or silicon nitride.

Another critical issue in high precision positioning applications is the support of the drive leg, i.e. how the applied load is taken up by the backing. Ideally the support should be equal for each drive leg in order to behave similar for applied loads in both drive directions. A non-ideal situation occurs for the two outer actuator elements in a drive element where there is only support at one side of the actuator element, e.g. as illustrated in FIGS. 1 and 2. For these actuator elements, the deflection due to an applied load will be larger in the non-supported direction. This asymmetry of the support can easily be solved by, as illustrated in FIG. 3, extend the actuator backing 12 of the actuator elements 14. It is thus preferable that the actuator elements 14 are mounted on a common backing 12 with an extension portion 13 on each side. In other words, the actuator backing 12 extends outside the outermost actuator elements. The extension portion 13 can also be used to route electrode layers from one side to the other side of the drive element in order to facilitate mounting on only one side. In FIG. 3, conductors 15 are indicated for contacting purposes.

In order to increase the heat conduction further through the actuator backing 12, heat conductors 22, e.g. made by metal, can be provided through the actuator backing 12 from the active volumes to any heat sink (not shown). (Only a few heat conductors are illustrated in the figure.)

Since the actuator elements 14a–d and the actuator backing 12 are made of different materials, special care has to be taken of the ways to mechanically attach the actuator elements 14a–d to the actuator backing 12. It is of high importance that the joint between the actuator elements 14a–d and the actuator backing 12 is very stiff indeed, since this is the most stressed part of the entire drive element 10. The joint has to be extremely stiff, showing as small deformation or resilient behavior as possible, both in short and long time terms. Furthermore, since the actuator elements 14a–d generates heat, the joints should not be affected by an increased temperature. According to the present invention, the joint between the actuator element 14a–d is of a irreversible type, i.e. once attached, the joint is not possible to remove by heat or chemical treatment. The most preferred joint is produced by co-sintering the actuator elements 14a–d and the actuator backing 12. This can be achieved by overlaying an actuator backing in its green state with active electromechanical material in its green state and then sintering this complex structure at the same time. In such a solution, one has to find material combinations that do not introduce too much mechanical stress during the sintering process.

Other possible ways to achieve an irreversible joint is to attach already sintered pieces to each other. Diffusion bonding or brazing are possible alternatives. Another alternative is to use a glue having as small creeping and deforming properties as possible, preferably of a thermoset plastic type. In this context, it is also important to point out that the volume of such a glue situated between the two bodies should be minimized, in order to minimize the deformation possibilities. The surfaces to be attached to each other should be carefully plane-polished before gluing.

Ideally, all heat generated within the actuator should be dissipated from the surface/interface of the drive leg. The largest available surface is the surface towards the surrounding medium. Normally, the drive leg surfaces are protected with some type of polymer to e.g. avoid sparking between bare electrodes entering the surface. However, such polymers are typically bad heat conductors. In order to enhance the cooling of the drive element, the surface in the embodiment of FIG. 3 is covered with an insulating material 24 that has as high heat conductivity as possible. (This covering is in FIG. 3 removed at the front side to reveal the inside structure of the drive element.) The insulating material 24 is in this embodiment a polymer filled with particles of heat conductive material, such as aluminum nitride or aluminum oxide. Another example of an insulating material that can be used in this way is a thin layer of aluminum oxide covering the entire surface. It is important to remember that the covering material 24 also should have good electrical insulating properties to avoid sparking between the electrodes. When heat is to be dissipated from the surfaces of the coated drive legs, the drive legs could be embedded in a heat conductive paste that will not influence the motion of the individual legs. The drive legs could also be immersed in a polymer or silicon base material filled with heat conductive material. The conductive paste or polymer or silicon base should typically be insulating. However, if an insulating material 24 with perfect coverage is used, also electrically conducting materials, such as metal powder, could be used as e.g. heat conductors in a polymer base.

Another cooling path from the drive element is, as mentioned before, through the contacting portion of the actuator elements to the body to be moved. In FIG. 3, the actuator elements 14a–d of the present embodiment have a driving surface 26 of a material with a good heat conduction. The driving surface has typically a high wear resistance and high hardness. The body to be moved has typically a large surface towards the surroundings and is furthermore typically made of a ceramic or metal material. In this embodiment, the drive surface 26 covers the entire element 14a–d, which means that also the heat transfer area between the element 14a–d and the body to be moved is large. In a typical actuator arrangement, the drive surface 26 is glued on top of the actuator elements 14a–d. However, in the presently preferred embodiment, also the drive surface is co-sintered with the main part of the monolithic body consisting of the actuator elements 14a–d and the actuator backing 12. From a processing point of view, this is an advantage, since the geometry of the driving surface 26, which determines many operational conditions, is fabricated in the same process step as the actuator elements 14a–d themselves, whereby a well controlled geometry dependence can be achieved. A co-sintering also generally gives a stiffer bond between the actuator element 14a–d and the driving surface 26. This is important in high accuracy positioning systems for the same reasons as presented further above with regards to the bond to the actuator backing 12.

Figures 4A, 4B:
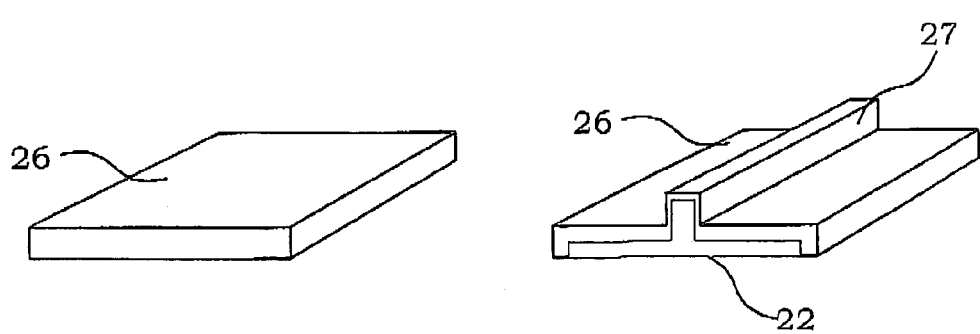
FIGS. 4a and 4b are perspective views of useful drive surfaces.

The geometry of the drive surface is important. In FIG. 4a, a flat drive surface 26 is illustrated. This shape has the advantage that the contact area with the body to be moved is large and presents therefore a high heat conductivity. The disadvantage is that a tilting of the actuator element results in a change in contact position between body and drive surface, which typically decreases the positioning accuracy.

In FIG. 4b, another drive surface 26 geometry is illustrated. Here, the actual drive portion is a ridge 27 in the middle of the drive surface 26. However, in order to improve the heat dissipation through this ridge 27, heat conductors 22 are integrated in the drive surface 26 for providing efficient heat paths from the actuator element surface to the top surface of the ridge 27.

Anyone skilled in the art realizes that other geometries of drive surface and possible heat conductors are possible and can be designed in a suitable way for each individual application. The embodiments of driving surfaces 26 of FIGS. 4a and 4b as well as many other useful geometries can easily be formed in a ceramic green state, which is suitable for co-sintering.

One technique to reduce the dissipated power is to reduce the drive voltage supplied to the actuator elements. Normally the peak-peak voltage is determined by the design of the motor and given by factors such as flatness of the body to be moved, flatness of drive surfaces of actuator elements and the desired clearance between the actuator elements and the body at the given normal force pressing the body against the actuator elements. These conditions are needed for controlled motion during positioning. For fast and silent long-stroke motion the actuator elements are preferably driven at ultrasonic frequencies. The actuator elements are then typically driven with phase shifted sinusoidal voltages and the actuator elements will move along an elliptical trajectory. At high frequency operation the clearance between actuator elements and body is not as critical and the voltage can be reduced. In particular if high frequencies are used since the time the elements need to be free from the body during the return motion is very short. The movement of the body in the longitudinal direction of the actuator elements will then be small due to the inertia of e.g. the body.

Figure 5A:
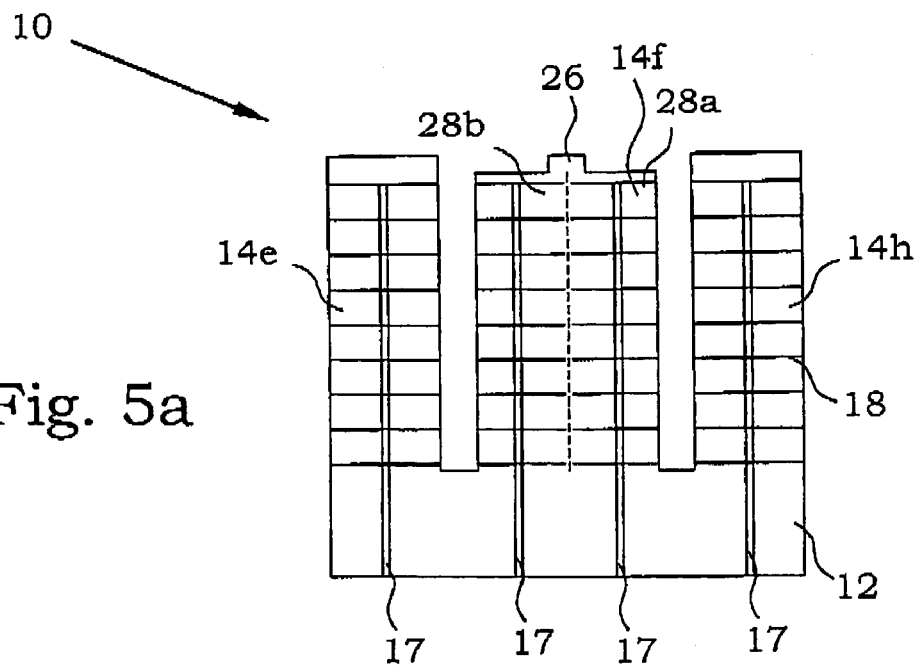
FIG. 5a is a cross-sectional view of another embodiment of a drive element according to the present invention.

As described above, the heat generation is intimately connected to the excitation and de-excitation procedures. Simplified motion patterns typically give a lower heat generation. An embodiment of a drive element 10, which is believed to give a lower heat generation, is illustrated in FIG. 5a. The number of actuator elements 14e, 14f, 14h is reduced to three. The middle actuator element 14f is of the same type as described in FIG. 3, having two active volumes 28a and 28b and which is capable of its tip in two dimensions. The end actuator elements 14e and 14h are, however, of a simpler design. These elements are built as a single stack of electromechanical layers and electrodes. When the electrodes are provided with voltage signals, the actuator elements 14e and 14h can be lengthened or shortened, but does not move its tip in the sideward direction (as defined by the figure). The actuator elements 14e, 14h are intended to be more or less stationary during operation (see further description below) and creates therefore only negligible amount of heat.

Figure 5B:
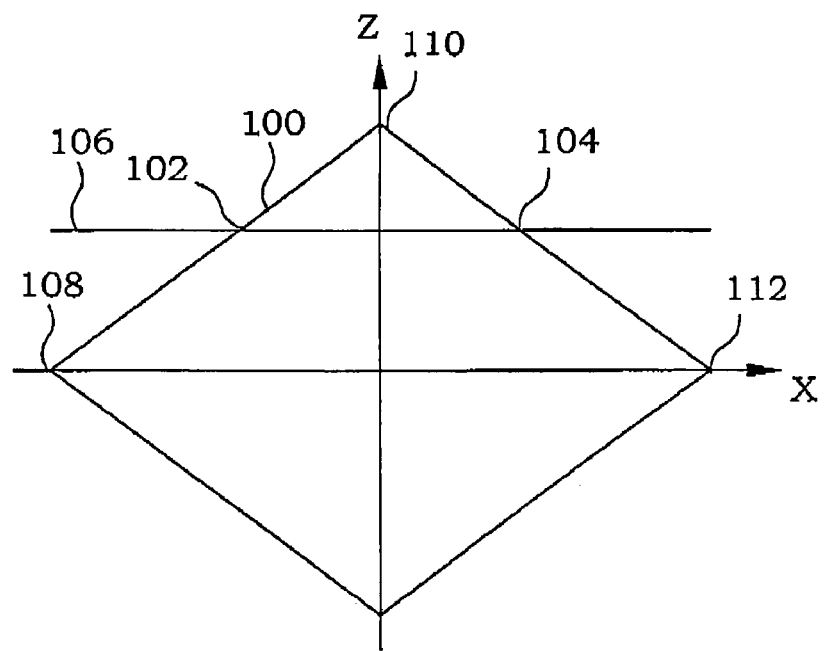

The driving operation of the drive element of FIG. 5a is illustrated by the diagram of FIG. 5b. The drive method is similar to the ordinary walking principle. The middle actuator element 14f drives the body in a similar fashion as in a normal walking mode. When the middle actuator element 14f comes to the release and return phases, the side actuator elements 14e, 14h holds the drive rail. However, since the side actuator elements 14e, 14h are not possible to bend, the motion of the body will be stopped during this phase.

The top of the middle actuator element 14f can be positioned within the rhombic path 100 illustrated in FIG. 5b. The side actuator elements 14e, 14h can be positioned in the vertical direction and is for the present description assumed to be placed at the height defined by a line 106. If the actuator element 14f starts from the point 108 the body will rest on the side elements 14e, 14h. When the actuator element 14f moves clockwise along the rhombic path 100, it will get in contact with the body at point 102 and lift it from the side elements 14e, 14h. The motion continues past the point 110 towards point 112, and when passing point 104, the actuator element 14f leaves the body again to the side elements 14e, 14h. The actuator element 14f can return and prepare for a new step.

One realizes that the step size is determined by the height of the side actuator elements 14e, 14h. By varying the elongation of these elements, the step size can be easily controlled. A fine-tuning of the position within each step is made by controlling the sideward motion of the actuator element 14f. One also realizes that the speed of the body is typically half of the speed available by the drive element of FIG. 3 at the same driving frequency. However, due to the simplified design, heat dissipation paths are easier to provide.

The motion of the body will typically be intermittent in the main motion direction, which may cause some noise. Also the delivering of the body from and to the actuator element 14f gives rise to noise. The actuator elements 14e and 14h can then be controlled to give a smooth retardation and acceleration, respectively, in the z direction, i.e. perpendicular to the main motion direction, in connection with the body transfer.

Figure 6:
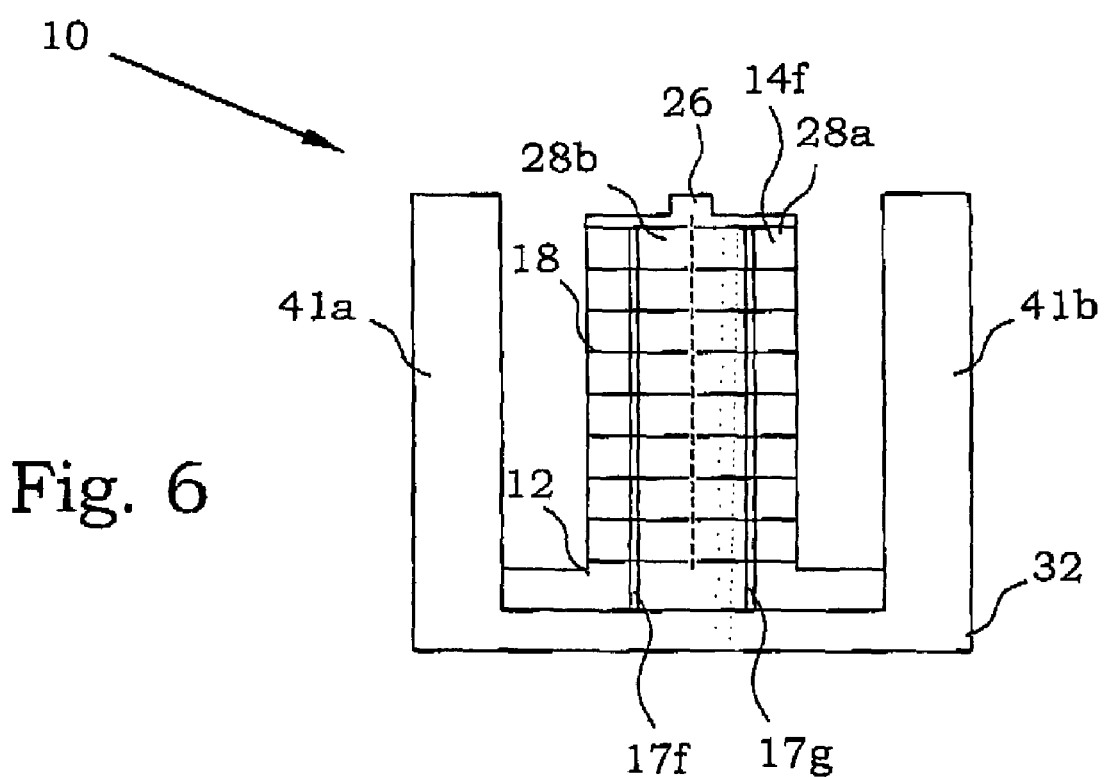
FIG. 6 is a cross-sectional view of yet another embodiment of a drive element according to the present invention.

FIG. 6 illustrates yet an embodiment of a drive element. In this embodiment, the configuration is even more simplified. In this embodiment, the side actuator elements are electromechanically passive support elements 41a, 41b. The operation principle is the same as for the embodiment in FIG. 5a, with the difference that the height of the side actuators can not be modified. However, since the actuator elements 41a, 41b are totally passive, they do not need to be made of an electromechanical material. Instead, the actuator elements 41a, 41b can be made of materials having a high heat conduction and assist in heat conducting from the active actuator element 14f. The actuator elements 41a, 41b are fixed to the actuator backing 12 according to the present invention in order to provide a reliable positioning accuracy. However, they may also be attached to an extra support 32, providing both extra stiffness and heat conductivity to the drive element assembly 10.

It will be understood by those skilled in the art that various modifications and changes may be made to the present invention without departing from the scope thereof, which is defined by the appended claims.

REFERENCES

S. Johansson, "One approach towards the fabrication of a microrobot system", Material Science and Engineering C2 (1995), pp. 141–149.

H. Cao and A. G. Evans, "Nonlinear deformation of ferroelastic ceramics" J. Am. Cer. Soc. 76 (1993), pp. 890–896.

U.S. Pat. No. 5,345,137
U.S. Pat. No. 6,066,911
U.S. Pat. No. 6,184,609
U.S. Pat. No. 6,337,532
DE 4408618

The invention claimed is:

1. Electromechanical actuator, comprising:
   a first set of at least one actuator element;
   a second set of at least one actuator element; and
   an actuator backing mechanically supporting the actuator elements of the first and second sets;
   the actuator backing being ferromechanically inactive,
   the actuator backing being free from mechanically induced polarization of the material due to ferroelastic deformation;
   the at least one actuator element of the first set comprising electromechanically active material and electrodes arranged such that the at least one actuator element of the first set upon application of suitable voltage signals to the electrodes present shape changes causing a tip of the at least one actuator element of the first set to move in two dimensions relative to the actuator backing; and
   the actuator elements of the first and second sets are mechanically attached to the actuator backing by an irreversible joint.

2. Electromechanical actuator according to claim 1, wherein the actuator elements of the first and second sets and the actuator backing are co-sintered.

3. Electromechanical actuator according to claim 1, wherein the actuator elements of the first and second sets and the actuator backing are brazed.

4. Electromechanical actuator according to claim 1, wherein the actuator elements of the first and second sets and the actuator backing are glued.

5. Electromechanical actuator according to claim 1, wherein the actuator elements of the first and second sets and the actuator backing are diffusion bonded.

6. Electromechanical actuator according to claim 1, wherein the actuator backing has a heat conductivity of at least 5 W/mK.

7. Electromechanical actuator according to claim 6, wherein the actuator backing has a heat conductivity of at least 10 W/mK.

8. Electromechanical actuator according to claim 1, wherein the actuator backing has a stiffness of at least 70 GPa.

9. Electromechanical actuator according to claim 8, wherein the actuator backing has a stiffness of at least 100 GPa.

10. Electromechanical actuator according to claim 1, wherein the actuator backing has integrated heat conductors.

11. Electromechanical actuator according to claim 1, wherein the at least one actuator element of the second set comprises electromechanically active material and electrodes arranged such that the at least one actuator element of the second set upon application of suitable voltage signals to the electrodes present shape changes causing a tip of the at least one actuator element of the second set to move relative to the actuator backing.

12. Electromechanical actuator according to claim 11, wherein the shape changes cause a tip of the at least one actuator element of the second set to move in two dimensions relative to the actuator backing.

13. Electromechanical actuator according to claim 1, wherein the at least one actuator element of the second set is an electromechanically passive support element.

14. Electromechanical actuator according to claim 1, wherein at least one actuator element has a drive surface of a material having a high heat conductivity.

15. Electromechanical actuator according to claim 1, wherein at least one actuator element is covered by a material having a high heat conductivity.

16. Electromechanical actuator according to claim 1, wherein the actuator backing extends outside the outermost actuator elements.

17. Electromechanical actuator, comprising:
a first set of at least one actuator element;
a second set of at least one actuator element; and
an actuator backing mechanically supporting the actuator elements of the first and second sets;
the actuator backing being ferromechanically inactive,
the actuator backing being free of ferroelastic deformation;
the at least one actuator element of the first set comprising electromechanically active material and electrodes arranged such that the at least one actuator element of the first set upon application of suitable voltage signals to the electrodes present shape changes causing a tip of the at least one actuator element of the first set to move in two dimensions relative to the actuator backing; and
the actuator elements of the first and second sets are mechanically attached to the actuator backing by an irreversible joint.

* * * * *